US007456471B2

(12) United States Patent
Anderson et al.

(10) Patent No.: US 7,456,471 B2
(45) Date of Patent: Nov. 25, 2008

(54) FIELD EFFECT TRANSISTOR WITH RAISED SOURCE/DRAIN FIN STRAPS

(75) Inventors: Brent A. Anderson, Jericho, VT (US); Thomas Ludwig, Sindelfingen (DE); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 18 days.

(21) Appl. No.: 11/532,207

(22) Filed: Sep. 15, 2006

(65) Prior Publication Data

US 2008/0067613 A1   Mar. 20, 2008

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ...................... 257/331; 257/401
(58) Field of Classification Search ................. 257/331, 257/401
See application file for complete search history.

(56) References Cited

U.S. PATENT DOCUMENTS

| | | | |
|---|---|---|---|
| 5,369,049 A | 11/1994 | Acocella et al. | |
| 5,923,971 A | 7/1999 | Ho et al. | |
| 6,413,802 B1 * | 7/2002 | Hu et al. | 438/151 |
| 6,525,403 B2 * | 2/2003 | Inaba et al. | 257/618 |
| 6,977,404 B2 | 12/2005 | Katsumata et al. | |
| 7,060,539 B2 * | 6/2006 | Chidambarrao et al. | 438/142 |
| 7,105,934 B2 * | 9/2006 | Anderson et al. | 257/213 |
| 7,115,947 B2 * | 10/2006 | Clark et al. | 257/347 |
| 7,120,046 B1 * | 10/2006 | Forbes | 365/149 |
| 7,154,118 B2 * | 12/2006 | Lindert et al. | 257/66 |
| 7,190,050 B2 * | 3/2007 | King et al. | 257/622 |
| 7,214,991 B2 * | 5/2007 | Yeo et al. | 257/401 |
| 7,268,026 B2 * | 9/2007 | Shimada | 438/166 |
| 7,323,375 B2 * | 1/2008 | Yoon et al. | 438/164 |
| 7,329,913 B2 * | 2/2008 | Brask et al. | 257/287 |
| 7,368,354 B2 * | 5/2008 | Anderson et al. | 438/283 |
| 2004/0266083 A1 * | 12/2004 | Hareland et al. | 438/199 |
| 2005/0073060 A1 * | 4/2005 | Datta et al. | 257/903 |
| 2005/0189583 A1 * | 9/2005 | Kim et al. | 257/327 |
| 2005/0199953 A1 | 9/2005 | Kawamura et al. | |
| 2006/0220131 A1 * | 10/2006 | Kinoshita et al. | 257/347 |
| 2006/0220134 A1 * | 10/2006 | Huo et al. | 257/351 |
| 2007/0001219 A1 * | 1/2007 | Radosavljevic et al. | 257/327 |
| 2008/0001234 A1 * | 1/2008 | Cheng et al. | 257/370 |

FOREIGN PATENT DOCUMENTS

JP    06-302821    10/1994

* cited by examiner

*Primary Examiner*—Ida M Soward
(74) *Attorney, Agent, or Firm*—Gibb & Rahman, LLC; Richard M. Kotulak, Esq.

(57) ABSTRACT

Therefore, disclosed above are embodiments of a multi-fin field effect transistor structure (e.g., a multi-fin dual-gate FET or tri-gate FET) that provides low resistance strapping of the source/drain regions of the fins, while also maintaining low capacitance to the gate by raising the level of the straps above the level of the gate. Embodiments of the structure of the invention incorporate either conductive vias or taller source/drain regions in order to electrically connect the source/drain straps to the source/drain regions of each fin. Also, disclosed are embodiments of associated methods of forming these structures.

20 Claims, 15 Drawing Sheets

FIELD EFFECT TRANSISTOR WITH RAISED SOURCE/DRAIN FIN STRAPS

BACKGROUND

1. Field of the Invention

The embodiments of the invention generally relate to multi-fin field effect transistors and, more particularly, to multi-fin field effect transistors having source/drain fin straps configured to minimize capacitance to the gate.

2. Description of the Related Art

As transistor design is improved and evolves, the number of different types of transistors continues to increase. Multi-gated non-planar metal oxide semiconductor field effect transistors (FETs), including dual-gate non-planar FETs (e.g., finFETs) and tri-gate non-planar FETs, were developed to provide scaled devices with faster drive currents and reduced short channel effects over planar FETs.

Dual-gate non-planar FETs are FETs in which a channel region is formed in the center of a thin semiconductor fin. The source and drain regions are formed in the opposing ends of the fin on either side of the channel region. Gates are formed on each side of the thin semiconductor fin, and in some cases, on the top or bottom of the fin as well, in an area corresponding to the channel region. FinFETs specifically are dual-gate non-planar FETs in which the fin is so thin as to be fully depleted. The effective fin width is determined by the fin height (e.g., short wide fins can cause partial depletion of a channel). For a finfet, a fin thickness of approximately one-fourth the length of the gate (or less) can ensure suppression of deleterious short-channel effects, such as variability in threshold voltage and excessive drain leakage currents. Fin-FETs are discussed at length in U.S. Pat. No. 6,413,802 to Hu et al., which is incorporated herein by reference Tri-gate non-planar FETs have a similar structure to that of dual-gate non-planar FETs; however, the fin width and height are approximately the same so that gates can be formed on three sides of the channel, including the top surface and the opposing sidewalls. The height to width ratio is generally in the range of 3:2 to 2:3 so that the channel will remain fully depleted and the three-dimensional field effects of a tri-gate FET will give greater drive current and improved short-channel characteristics over a planar transistor. For a detail discussion of the structural differences between dual-gate and tri-gate FETs see "Dual-gate (finFET) and Tri-Gate MOS-FETs: Simulation and Design" by A Breed and K. P. Roenker, Semiconductor Device Research Symposium, 2003, pages 150-151, December 2003 (incorporated herein by reference).

The effective channel width of both dual-gate and tri-gate FETs can be increased by incorporating multiple fins into the FET structure. In such multi-fin FETs, the source/drain regions of each fin are often strapped together with conductive straps. These source/drain straps mimic the source/drain regions of planar field effect transistors and allow for more flexible placement of contact vias. However, capacitance between the gate and the source/drain straps and, particularly, between the gate and a drain strap can significantly increase circuit delay (i.e., degrade switching speed) and increase power, due to the Miller effect. Therefore, there is a need in the art for a multi-fin field effect transistor structure and method of forming the structure that provides low resistance strapping of the source/drain regions of the fins, while also maintaining low capacitance to the gate.

SUMMARY

In view of the foregoing, disclosed herein are embodiments of a multi-fin field effect transistor structure (e.g., a multi-fin dual-gate or tri-gate FET) that provides low resistance strapping of the source/drain regions of the fins, while also maintaining low capacitance to the gate by raising the level of the straps above the gate. Embodiments of the structure of the invention incorporate either conductive vias or taller source/drain regions in order to electrically connect the raised source/drain straps to the source/drain regions of each fin in the structure. Also, disclosed are embodiments of associated methods of forming these structures.

More particularly, disclosed herein are embodiments of a field effect transistor (FET) that comprises a plurality of parallel semiconductor fins on an isolation layer. The isolation layer provides electrical isolation of the semiconductor fins from the underlying substrate and may comprise, for example, an insulator or isolating semiconductor regions. Each fin comprises source/drain regions in its opposing ends and a channel region in its center portion between the source/drain regions. For a tri-gate FET, the channel region of each fin can, for example, have a height to width ratio that ranges between approximately 3:2 and 2:3. Whereas, for a finFET, the channel region of each fin can, for example, have a height to width ratio that is approximately 4:1. Optionally, in each fin the source/drain regions at the opposing ends can be wider than the channel region in the center portion n order to reduce resistance. A gate traverses the center portion of each fin such that it covers the top surface and opposing sidewalls of each channel region. The top surface of the gate and the top surfaces and, optionally, the opposing sidewalls of the source/drain regions can comprise a silicide.

Additionally, raised conductors (i.e., raised source/drain straps) traverse and are electrically connected to the source/drain regions of each fin. Specifically, one conductor traverses and is electrically connected to the fins at one end and another conductor traverses and is electrically connected to the fins at the other end. However, in order minimize capacitance to the gate, the level of the conductors is raised above the level of the gate. Thus, a first distance between the isolation layer and a top surface of the gate is less than a second distance between the isolation layer and a bottom surface of each conductor.

In one embodiment vias extend between the raised source/drain straps and each of the fins so as to electrically connect the fins to the straps. Specifically, for each fin, a first via extends from a first end of the fin to the first conductor and a second via extends from a second end of the fin to the second conductor. These vias can be lined with a conductive lining (e.g., titanium (Ti), tantalum (Ta), titanium nitride (TiN), tantalum nitride (TaN), etc.) and can be filled with a conductive material (e.g., copper (Cu)).

A method of forming the embodiment of the field effect transistor, described above, with vias that electrically connect the raised conductors (i.e., the raised source/drain straps) to the fins can comprise providing a wafer with a semiconductor layer on an isolation layer. Parallel semiconductor fins are formed in the semiconductor layer. Specifically, the fins are patterned so that the height to width ratio in the center portion (i.e., the channel region) is appropriate for the type of FET being formed (e.g., finFET or tri-gate FET). Additionally, the fins can be patterned so that the ends of the fins (i.e., the source/drain regions) are wider than this center portion. After fin formation, a gate can be formed that traverses the center portion (i.e., the channel region) of each fin covering both the top surface and opposing sidewalls. Additional FET processing, including source/drain implantation and silicide formation, can be performed following gate formation.

Then, a dual damascene process can be used to form the raised conductors (i.e., raised source/drain straps) that traverse the fins at each end as well as the vias that electrically connect the source/drain straps to the source/drain regions of each fin. Specifically, a first dielectric layer can be formed over the structure and trenches are formed in this first dielectric layer. That is, a first trench is formed that traverses the fins at a first end and a second trench is formed that traverses the fins at a second end. These trenches are also formed so that a first distance between the isolation layer and a top surface of the gate is less than a second distance between the isolation layer and the bottom surfaces of the trenches. Then, via holes are formed through the first dielectric layer in the bottom surfaces of the trenches such that each fin is contacted by two via holes: a first via hole at a first end with a first source/drain region and a second via hole at a second end with a second source/drain region. The via holes and trenches are then filled with a conductor.

To fill the via holes and trenches, they are first lined with an electrically conductive liner (e.g., tantalum (Ta), tantalum nitride (TaN), titanium (Ti), titanium nitride (TiN), etc.). Once the via holes and trenches are lined, an electroplating process can be performed to fill the via holes and trenches with a conductor (e.g., copper (Cu)). After the electroplating process, a polishing process is performed in order to remove any conductive material (e.g., the conductor or conductive liner) from above the first dielectric layer.

After removing any conductive material from the first dielectric layer, a second dielectric layer can be formed over the first dielectric layer and over the conductor-filled trenches (i.e., over the source/drain straps). Contact vias can be formed through the second dielectric layer to the source/drain straps and gate below.

In another embodiment of the field effect transistor of the invention, instead of using vias to electrically connect the raised conductors (i.e., the raised source/drain straps) to the fins, the source/drain regions are made taller. Specifically, the channel region of each fin has a first height that is shorter than a second height of the source/drain regions such that a first distance between the isolation layer and a top surface of the gate is less than a second distance between the isolation layer and the bottom surfaces of the source/drain straps. For example, the height of the source/drain regions can be approximately twice the height of the channel region to ensure that the raised source/drain straps are above the level of the gate. However, to reduce the resistance in the source/drain regions caused by the increased height, the top portion (e.g., the top half) of the fins in the source/drain regions can comprise a silicide.

A method of forming the field effect transistor, described above, with taller source/drain regions connected to raised source/drain straps can comprise providing a wafer with a semiconductor layer on an isolation. Parallel semiconductor fins can be formed from the semiconductor layer such that each of the fins has a center portion (i.e., a channel region) with a first height that is disposed between opposing ends (i.e., source/drain regions) with a second height and such that the first height is less than the second height. For example, the ends of the fins can be formed so that they are approximately twice as tall as the center portion of the fins.

More specifically, a wafer is provided that comprises a semiconductor layer, having the predetermined second height. A hard mask is formed on the semiconductor layer and then, etched to form a trench that exposes a section of the semiconductor layer. The exposed surface of this section of the semiconductor layer is oxidized. Optionally, the oxidized portion of the semiconductor layer is planarized or removed. The remainder of the semiconductor layer in this section is left with a reduced height (i.e., the first height) that is less than (e.g., approximately ½) the height of the rest of the semiconductor layer (i.e., the second height).

The fins are then formed in the semiconductor layer such that the center portion (i.e., the channel region) of each fin has the first height and the ends (i.e., the source/drain regions) have the second height. Additionally, the fins are patterned so that the height to width ratio in the center portion (i.e., the channel region) is appropriate for the type of FET being formed (e.g., finFET or tri-gate FET).

After fin formation, a gate can be formed that traverses the center portion (i.e., the channel regions) of each fin covering the top surfaces and opposing sidewalls and a silicide can be formed in the top surface of the gate.

Then, a first dielectric layer can be formed over the entire structure. The first dielectric layer can be planarized to expose the hard mask and the remainder of the hard mask can be selectively removed to expose the ends (i.e., the source/drain regions) of the fins.

After selectively removing the remainder of the hard mask, additional FET processing, including source/drain implantation and silicide formation, can be performed.

Specifically, in order to reduce resistance caused by the increased height in the source/drain regions a thick silicide can be formed in a top portion (e.g., a top half) of the source/drain regions of each of the fins.

Then, the raised conductors (i.e., the raised source/drain straps) are formed on the tall source/drain regions. For example, a conductive material, such as tungsten (W), can be deposited over the structure, lithographically patterned and etched to form straps that traverse each of the fins at both ends (i.e., a first source/drain strap at a first end and a second source/drain strap at a second end).

After the source/drain straps are formed, a second dielectric layer can be formed over the straps. Contact vias can be formed through the second dielectric layer to the source/drain straps and gate below.

These and other aspects of the embodiments of the invention will be better appreciated and understood when considered in conjunction with the following description and the accompanying drawings. It should be understood, however, that the following descriptions, and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
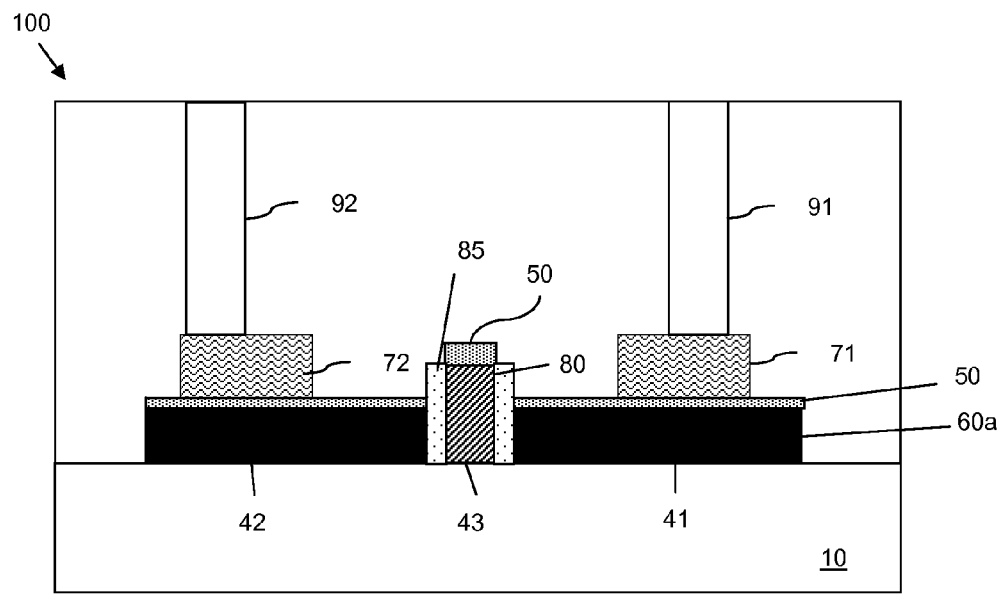
FIG. 1 is a schematic diagram illustrating a cross-sectional view of a multi-fin field effect transistor with source/drain straps.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above and referring to FIGS. 1 and 2 in combination, the effective channel width of both dual-gate FETs and tri-gate FETs can be increased by incorporating multiple fins 60a-c into the FET structure 100. In dual-gate and tri-gate FETs, the source/drain regions 41, 42 of multiple fins 60a-c are often strapped together with conductive straps (i.e., source/drain straps 71, 72). These source/drain straps 71, 72 mimic the source/drain regions of planar FETs and allow for more flexible placement of contact vias 91, 92. However, as illustrated in structure 100 of FIG. 1, these conductive source/drain straps 71, 72 are typically formed in the same horizontal plane as the gate 80 and result in parasitic capacitance. This capacitance between the gate 80 and the source/drain straps 71, 72 and, particularly, between the gate and the drain strap can significantly increase circuit delay (i.e., degrade switching speed) and increase power, due to the Miller effect. Therefore, there is a need in the art for a multi-fin field effect transistor structure and method of forming the structure that provides low resistance strapping of the source/drain regions of the fins, while also maintaining low capacitance to the gate.

Figure 2:
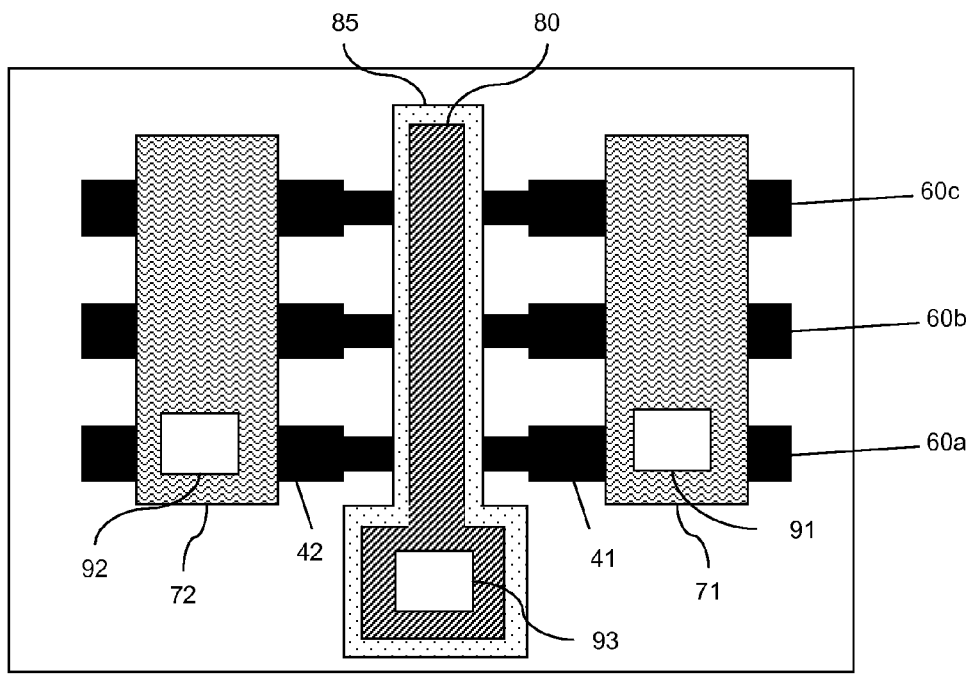
FIG. 2 is a schematic diagram illustrating a top view of a multi-fin field effect transistor with source/drain straps.
Figure 3:
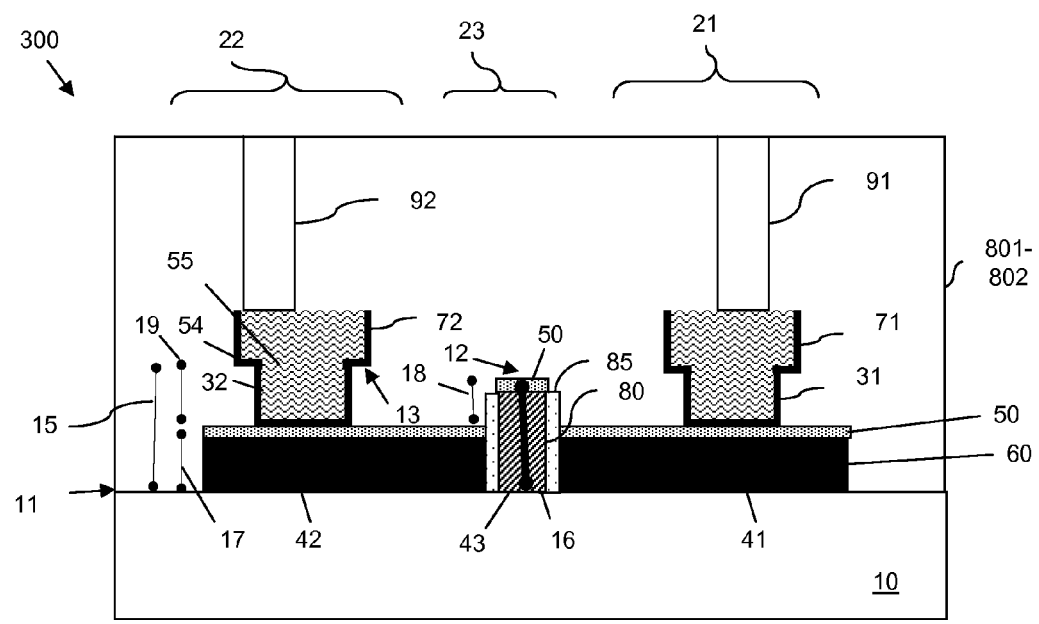
FIG. 3 is a schematic diagram illustrating a cross-sectional view of an embodiment of the multi-fin field effect transistor with raised source/drain straps of the invention.
Figure 4:
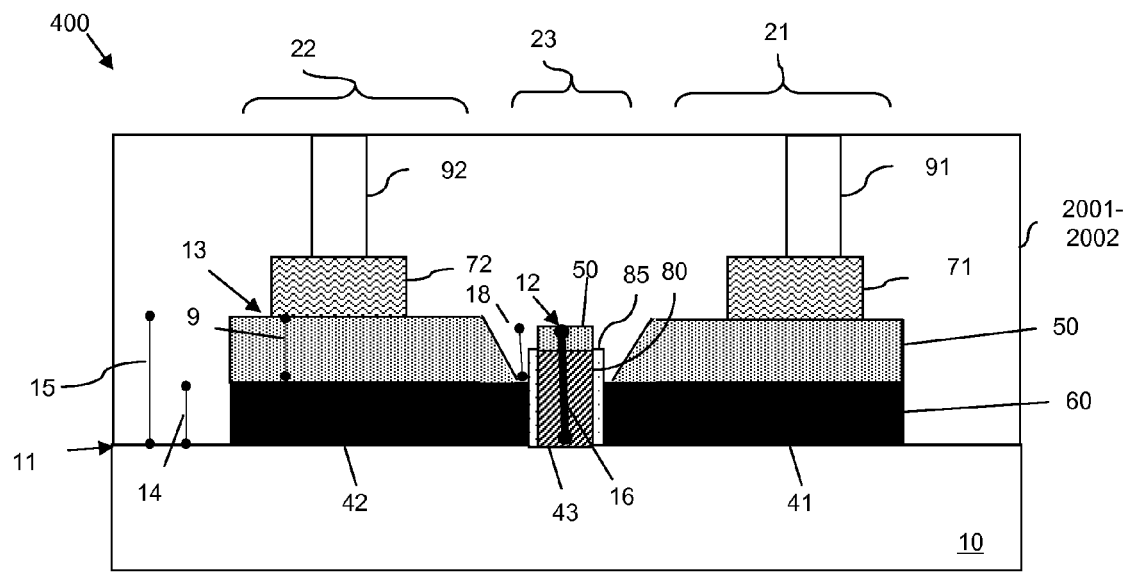
FIG. 4 is a schematic diagram illustrating a cross-sectional view of an embodiment of the multi-fin field effect transistor with raised source/drain straps of the invention.

In view of the foregoing and referring to both FIGS. 3 and 4 in combination with FIG. 2, disclosed herein are embodiments of a multi-fin field effect transistor structure (e.g., a multi-fin dual-gate FET, such as a finFET, or a multi-fin tri-gate FET) that provides low resistance strapping of the source/drain regions 41, 42 of the fins 60a-c, while also maintaining low capacitance to the gate 80 by raising the level of the straps 71, 72 above the level of the gate 80. Embodiments of the structure of the invention incorporate either conductive vias 31, 32 (see structure 300 of FIG. 3) or taller source/drain regions (see structure 400 of FIG. 4) in order to electrically connect the source/drain straps 71, 72 to the source/drain regions 41, 42 of each fin 60a-c. Also, disclosed are embodiments of associated methods of forming these structures.

More particularly, disclosed herein are embodiments of a field effect transistor 300 of FIG. 3 or 400 of FIG. 4 configured as a dual-gate FET, such as a finFET, or a trigate FET. The structures 300 and 400 each comprise a plurality of parallel semiconductor fins 60a-c on an isolation layer 10 (see FIG. 2). The isolation layer provides electrical isolation of the semiconductor fins from the underlying substrate and may comprise an insulator, such as an insulator formed using a Silicon-On-Insulator (SOI) wafer, or alternatively, may comprise isolating semiconductor regions. These semiconductor fins can, for example, comprise silicon fins.

Each fin 60 comprises source/drain regions 41, 42 in opposing ends 21, 22 and a channel region 43 in the center portion 23 between the source/drain regions 41, 42. The source/drain regions and channel region of each fin can be appropriately doped depending upon whether the FET is an n-FET or p-FET.

Additionally, the height, width, and doping of the channel region of each fin can be predetermined depending upon whether the FET is a fully or partially depleted dual-gate FET or a tri-gate FET. For example, for a tri-gate FET, the channel region 43 of each of the fins 60 can have a predetermined height to width ratio that ranges between approximately 3:2 and 2:3. Whereas, for a finFET (e.g., a fully depleted dual-gate FET), the channel region 43 of each of the fins 60 can have a predetermined height to width ratio that is approximately 4:1, or more.

Optionally, the ends 21, 22 (i.e., the source/drain regions 41, 42) of each of the fins 60 can be wider than the center 23 (i.e., the channel region 43) in order to reduce resistance. For example, the width of the center portion 23 of each fin can be approximately 3-40 nm and the width at the ends 21, 22 can be three or more times wider (e.g., approximately 9-200 nm) than the center portion. Also, the top surface 12 of the gate 80 and the top surfaces and, optionally, the opposing sidewalls of the ends 21, 22 (i.e., the source/drain regions 41, 42) of the fins 60 can comprise a silicide 50.

A gate 80 traverses the center portion 23 (i.e., the channel region 43) of each fin 60 such that it covers the top surface and opposing sidewalls. Specifically, a thin gate dielectric layer is adjacent to the opposing sidewalls and optionally, the top surface, of the center portion 23 of each fin and a deposited and patterned gate conductor (e.g., a gate polysilicon) is on the gate dielectric layer. The gate 80 is contacted by a single contact via 93. The gate is furthermore bordered by an electrically insulating spacer 85, typically comprising silicon nitride or silicon dioxide.

Additionally, raised conductors 71, 72 (e.g., copper (Cu) or tungsten (W) source/drain straps) traverse and are electrically connected to the top surfaces, and optionally a portion of the sidewalls, of the source/drain regions 41, 42 of each of the fins 60. Specifically, one conductor 71 (i.e., a first conductor or first source/drain strap) traverses and is electrically connected to the fins 60 at one end 21 (i.e., connected to the first source/drain regions 41 of each fin 60 at a first end 21) and another conductor 72 (i.e., a second conductor or second source/drain strap) traverses and is electrically connected to the fins at the other end 22 (i.e., connected to the second source/drain regions 42 of each fin at a second end 22). However, in order to minimize capacitance to the gate 80 and, particularly, between the gate conductor and the conductive straps, the level of the conductors 71, 72 is raised above the gate 80. Thus, a first distance 16 between the isolation layer 10 and a top surface 12 of the gate 80 is less than a second distance 15 between the isolation layer 10 and a bottom surface 13 of each conductor 71, 72. As mentioned above, embodiments of the invention incorporate either conductive vias 31, 32 (see structure 300 of FIG. 3) or fins with taller source/drain regions 41, 42 (see structure 400 of FIG. 4) in order to electrically connect the source/drain straps 71, 72 to the source/drain regions 41, 42 of the fins 60.

Referring to FIG. 3 in combination with FIG. 2, in the structural embodiment 300 of the invention vias 31, 32 extend between the raised conductors 71, 72 (i.e., the source/drain straps) and each of the fins 60*a-c* in order to electrically connect the fins 60*a-c* and raised conductors 71, 72. Specifically, for each fin 60, a first via 31 extends between a first end 21 of the fin and the first conductor 71 and a second via 32 extends between a second end 22 of the fin and the second conductor 72. These vias 31, 32 can be lined with a conductive lining 54 (e.g., titanium (Ti), tantalum (Ta), titanium nitride (TiN), tantalum nitride (TaN), etc.) and can be filled with a conductive material 55 (e.g., copper (Cu)). The length of the vias 31, 32 between the fins and conductors should be a predetermined length that is greater than the height 18 of the gate above the fins. With current processing techniques, the length 18 of the portion of the gate 80 that is above the center portion 23 of the fins 60 is typically approximately equal to the height 17 of the fins 60. Thus, the predetermined length 19 of the vias 31, 32 will be approximately equal to or greater than the length 18 of the portion of the gate 80 above the fins 60 as well as the height 17 of the fins themselves.

Figure 5:
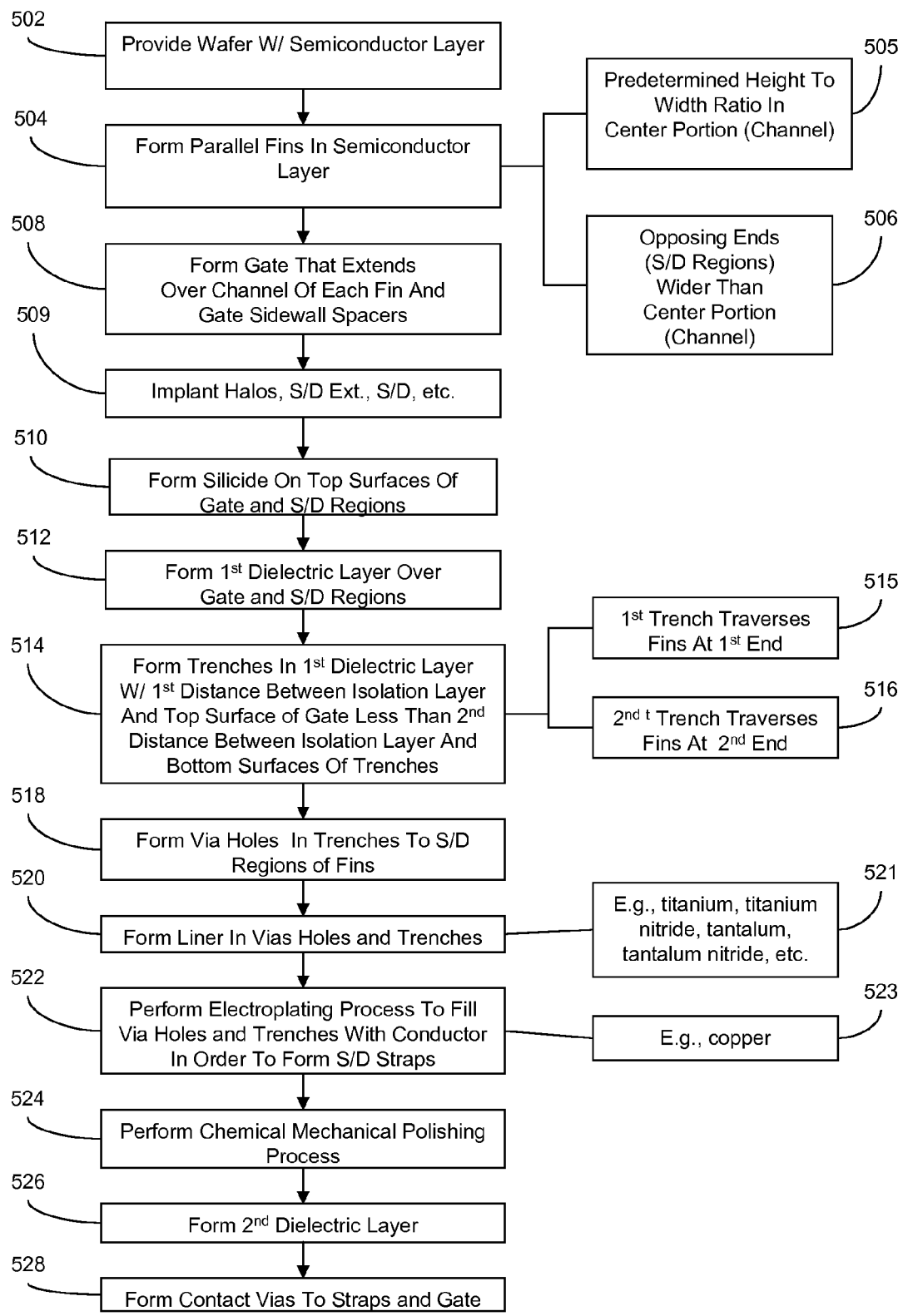
FIG. 5 is a flow diagram illustrating an embodiment of a method of forming the field effect transistor 300 of FIG. 3.

Referring to FIG. 5, an embodiment of a method of forming the field effect transistor 300 of FIG. 3 with vias 31, 32 that electrically connect the source/drain straps 71, 72 to the fins 60 can comprise providing a wafer that comprises a semiconductor layer (e.g., a silicon layer) on an isolation layer 10 (502).

Figure 6:
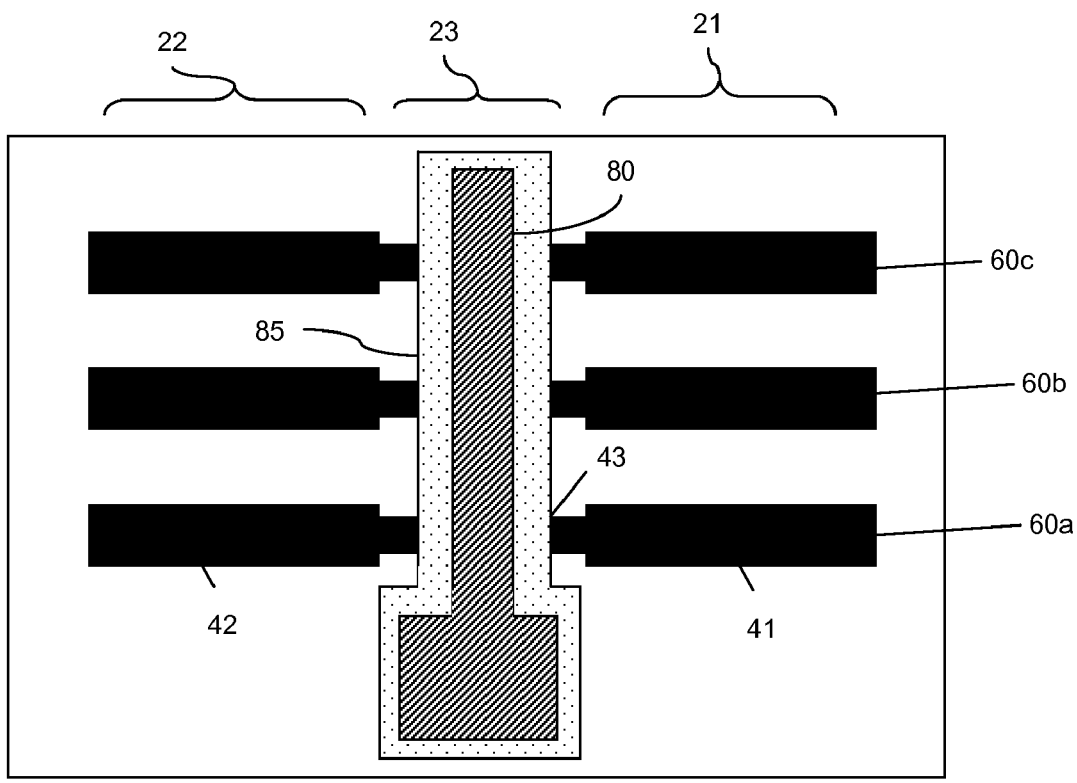
FIG. 6 is a schematic diagram illustrating a top view of a partially completed field effect transistor 300.

Parallel semiconductor fins 60*a-c* are formed, using conventional lithographic processing techniques, in the semiconductor layer on the isolation layer 10 (504, see FIG. 6). The fins 60 are patterned so that the height to width ratio in the center portion corresponding to the channel region is appropriate for the type of FET being formed (505). Specifically, if a tri-gate FET is being formed, the fins can be patterned and etched so that the center portion 23 in which the channel region 43 will subsequently be formed has a height to width ratio that ranges between approximately 3:2 and 2:3. Furthermore, an insulating cap (not shown) can be disposed on the top of the fin to provide a dielectric on the top surface of the fin which will be thicker than the gate dielectric on the sidewalls of the fin. This may be formed by oxidation of the exposed silicon to form a cap of silicon dioxide, typically between 4 nm and 20 nm thick. If a finFET is being formed, the fins can be patterned and etched so that the center portion 23, in which the channel region 43 will subsequently be formed, has a height to width ratio of approximately 4:1. Additionally, the fins 60*a-c* can be patterned so that the opposing ends 21, 22, (i.e., the source/drain regions 41, 42) are wider than the center portion 23 (i.e., the channel region 43) (506). For example, the width of the center portion 23 of each fin 60 can be approximately 3-40 nm and the width of the opposing ends 21, 22 can be three or more times wider (e.g., approximately 9-200 nm) than the center portion 23.

After fin formation at process 504, a gate 80 can be formed that traverses the center portion 23 of each fin, thereby, covering the channel regions 43 (508). Specifically, a thin gate dielectric layer can be deposited or grown on the sidewalls, and optionally on the top surface, of the center portion of each fin. Then, a gate conductor can be deposited on the gate dielectric layer and lithographically patterned so that it extends across the center portion of each fin. Additionally, electrically insulating sidewall spacers 85 (e.g., silicon nitride or silicon dioxide sidewall spacers) can be formed adjacent to the gate sidewalls using conventional sidewall spacer processing techniques.

Figure 7:
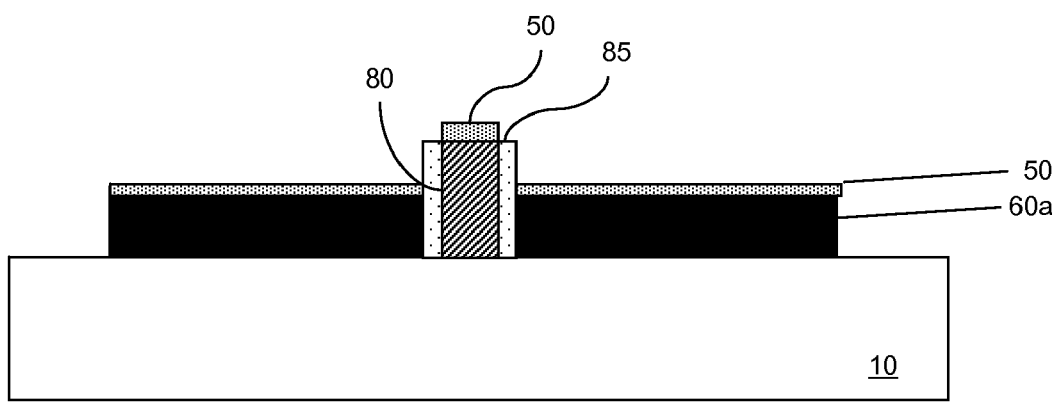
FIG. 7 is a schematic diagram illustrating a cross-sectional view of the structure of FIG. 6.

Following gate formation at process 508, additional FET processing can be performed (e.g., halo implantation, source/drain extension implantation, source/drain implantation, fin spacer formation, gate sidewall spacer formation, etc.) (509). Additionally, silicon or silicon/germanium can be selectively grown on the exposed ends of the fins, and a silicide 50 (e.g., cobalt, platinum, or nickel silicide) can be formed in the top surface 12 of the gate conductor 80 and the top surfaces and, optionally, the sidewalls of source/drain regions 41, 42 of each of the fins 60 (510, see FIG. 7).

Figure 8:
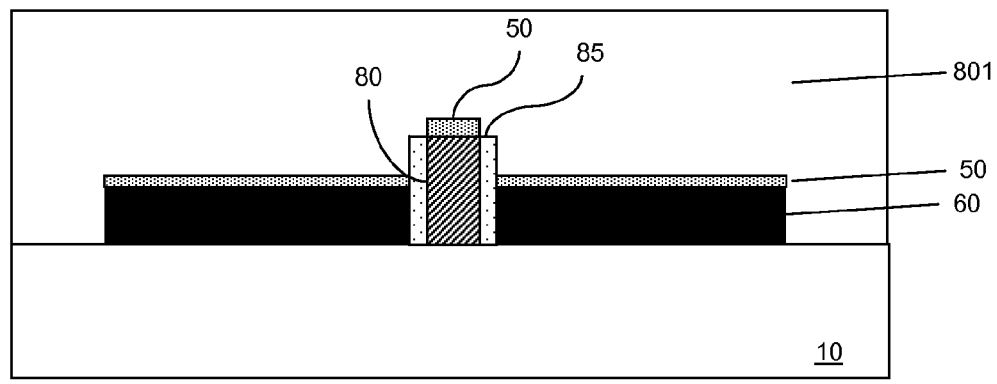
FIG. 8 is a schematic diagram illustrating a cross-sectional view of a partially completed field effect transistor 300.
Figure 9:
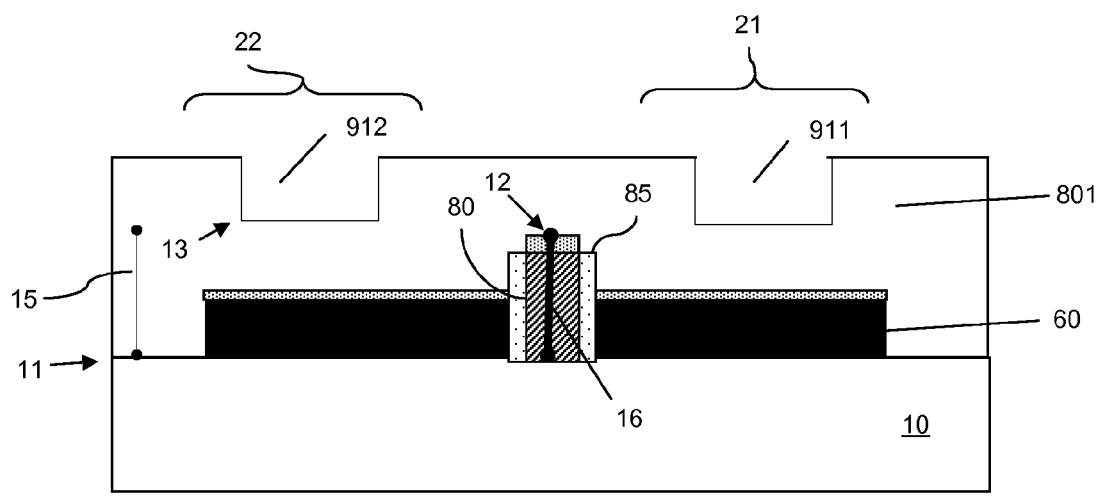
FIG. 9 is a schematic diagram illustrating a cross-sectional view of a partially completed field effect transistor 300.
Figure 10:
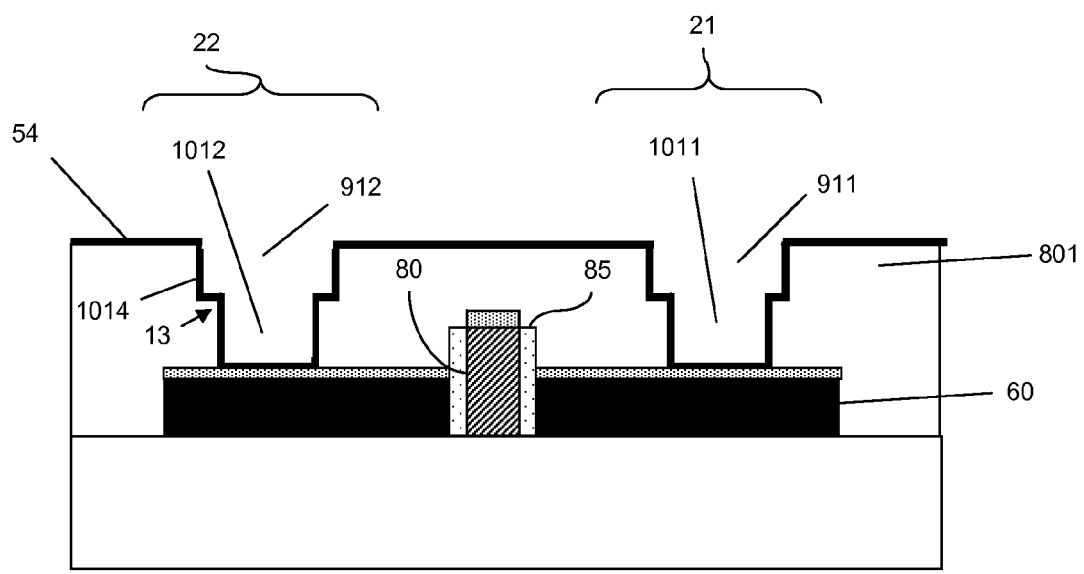
FIG. 10 is a schematic diagram illustrating a cross-sectional view of a partially completed field effect transistor 300.

A conventional dual damascene process can be used to form the raised conductors 71, 72 (i.e., the metal (e.g., Cu) source/drain straps) that traverse the fins 60 at each end 21, 22 as well as the vias 31, 32 that electrically connect the source/drain straps 71, 72 to the source/drain regions of each fin in structure 300 of FIG. 3. Specifically, a first dielectric layer 801 (e.g., an oxide layer) can be formed (e.g., deposited) over the structure (i.e., over the fins 60 and gate 80) and planarized (512, see FIG. 8). Then, trenches 911, 912 are formed (e.g., lithographically patterned and etched) in the first dielectric layer 801 such that a first trench 911 traverses the fins 60 at a first end 21 and a second trench 912 traverses the fins 60 at a second end 22 and such that a first distance 16 between the isolation layer 10 and a top surface 12 of the gate 80 is less than a second distance 15 between the isolation 10 layer and the bottom surfaces 13 of the trenches 911, 912 (514-516, see FIG. 9). After the trenches are formed via holes 1011, 1012 are formed through the first dielectric layer 801 in the bottom surfaces 13 of the trenches such that each of the fins 60 is contacted by corresponding two via holes: one at the first end 21 of the fin and another at the second end 22 of the fin (518, see FIG. 10).

The via holes 1011, 1012 and trenches 911, 912 are then filled with a conductor 55. More specifically, the vias 1011, 1012 and the trenches 911, 912 are lined with an electrically conductive liner 54 (e.g., tantalum (Ta), tantalum nitride (TaN), titanium (Ti), titanium nitride (TiN), etc.) (520, see FIG. 10). Once the via holes 1011, 1012 and trenches 911, 912 are lined at process 520, an electroplating process can be performed to fill the lined via holes 1011, 1012 and trenches 911, 912 with the conductor 55 (e.g., copper (Cu)) (522). Thus, the metal source/drain straps 71, 72 are formed above the level of the gate 80 and are electrically connected to the source/drain regions 41, 42 by vias 31, 32. Optionally, vias (contacts) to the gate electrode may be simultaneously formed during these process steps.

Figure 11:
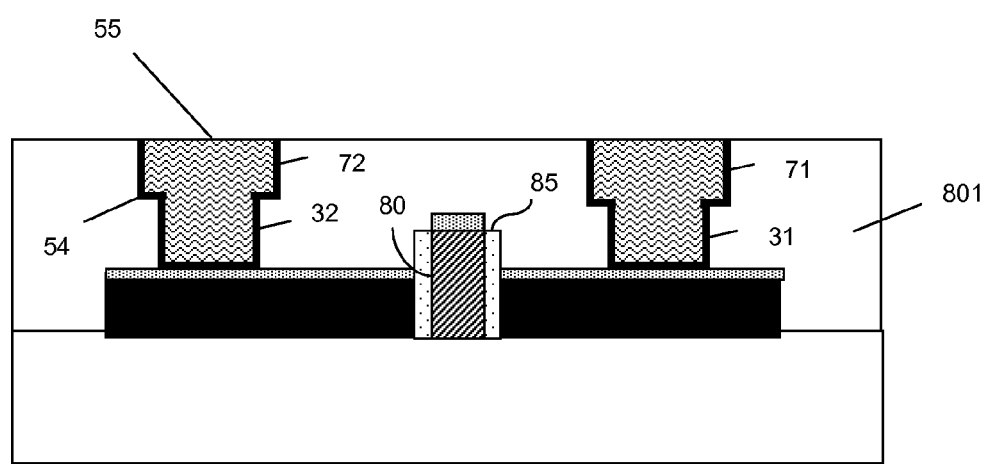
FIG. 11 is a schematic diagram illustrating a cross-sectional view of a partially completed field effect transistor 300.

After the electroplating process at 522, a polishing process (e.g., chemical mechanical planarization) is performed in order to remove any conductive material (e.g., the conductor 55 or conductive liner 54) from above the first dielectric layer 801 (524, see FIG. 11).

Figure 12:
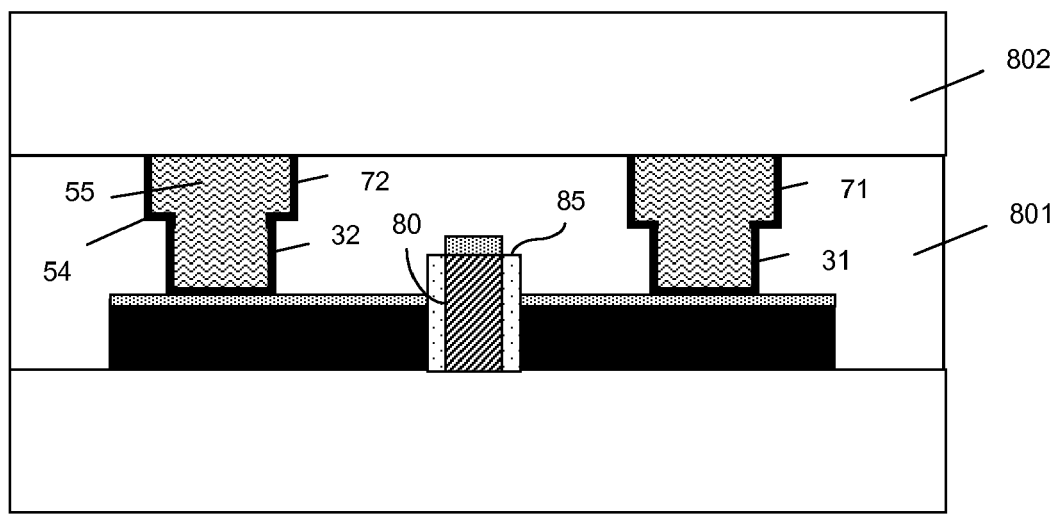
FIG. 12 is a schematic diagram illustrating a cross-sectional view of a partially completed field effect transistor 300.

After removing any conductive material from the first dielectric layer 801 at process 524, a second dielectric layer 802 (e.g., another oxide layer) can be formed (e.g., deposited) over the first dielectric layer 801 and over the conductor-filled trenches (i.e., the source/drain straps 71, 72) (526, see FIG. 12). The second dielectric layer is then planarized and at each end 21, 22 of the transistor, an additional via 91, 92 (i.e., a contact via) can be formed through the second dielectric layer 802 to the corresponding source/drain strap 71, 72 below (528, see FIG. 3). A contact via 93 can simultaneously be formed through the second dielectric layer 802 to the gate 80 (see FIG. 2).

Alternatively, referring to FIG. 4 in combination with FIG. 2, in the field effect transistor 400 of the invention instead of using vias to electrically connect the raised conductors 71, 72 (i.e., the raised source/drain straps) to the fins 60, the source/drain regions 41, 42 are made taller. Specifically, the center portion 23 (i.e., the channel region 43) of each of the fins 60 has a first height 14 that is shorter than a second height 15 of the ends 21, 22 (i.e., the source/drain regions 41, 42) of the fins. The straps 71, 72 are placed directly on the taller source/drain regions 41, 42 such that a first distance 16 between the isolation layer 10 and a top surface 12 of the gate 80 is less than a second distance 15 between the isolation layer 10 and the bottom surfaces 13 of the source/drain straps 71, 72 (i.e., the height of the fins at the ends 21, 22).

For example, with current processing techniques, the length 18 of the portion of the gate that is above the center portion 23 of the fins 60 is typically approximately equal to the height 14 of the fins at that center portion. Thus, the second height 15 of the source/drain regions 41, 42 in this embodiment can be approximately twice the first height 14 of the channel region 43 or greater to ensure that the source/drain straps 71, 72 are above the level of the gate 80. However, to reduce the resistance in the source/drain regions 41, 42 caused by the increased height, the top portion 9 (e.g., the top half) of the fins 60 in the source/drain regions 41, 42 can comprise a thick silicide 50.

Figure 13:
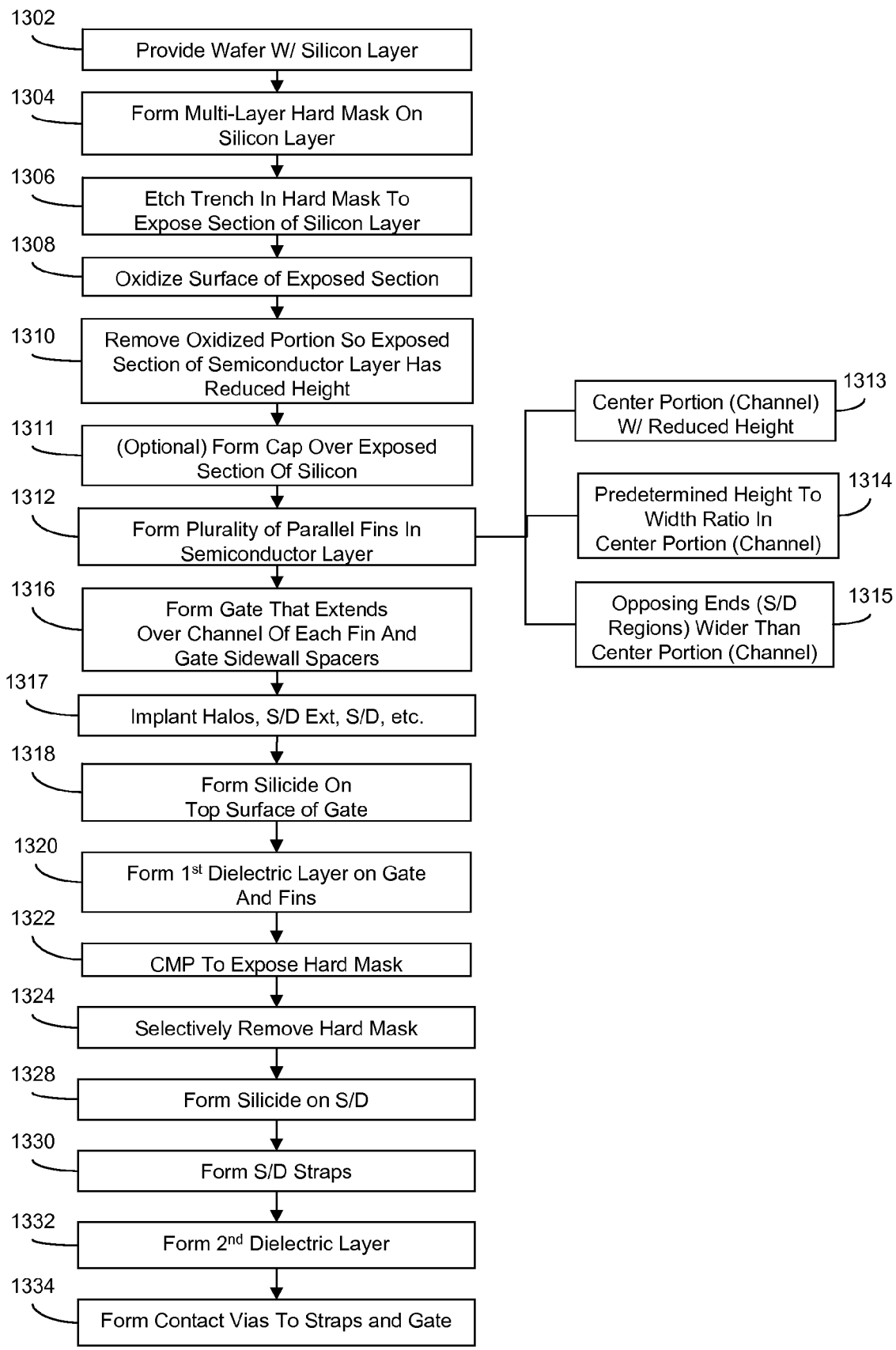
FIG. 13 is a flow diagram illustrating an embodiment of a method of forming the field effect transistor 400 of FIG. 4.

Referring to FIG. 13, an embodiment of a method of forming the field effect transistor 400 of FIG. 4 with taller source/drain regions 41, 42 can comprise forming parallel semiconductor fins 60 from a semiconductor layer on an isolation layer 10 such that each of the fins 60 has a center portion 23 corresponding (i.e., a channel region 43) with a first height 14 and ends 21, 22 (i.e., source/drain regions 41, 42) with a second height 15 on either side of the center portion 23. Specifically, the center portion 23 of each fin is formed with a height 14 that is less than (e.g., approximately ½) that of the ends 21, 22 of the fins 60.

Figure 14:
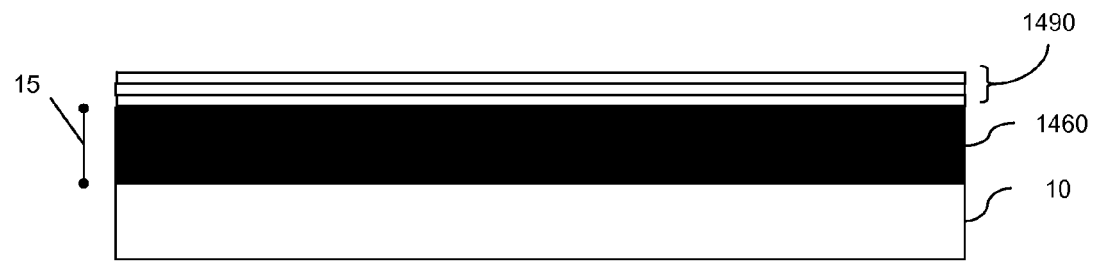
FIG. 14 is a schematic diagram illustrating a cross-sectional view of a partially completed field effect transistor 400.

More specifically, a wafer is provided that comprises a semiconductor layer 1460 (e.g., a silicon layer), having a predetermined height 15 (i.e., the second height), on an isolation layer 10 (1302, see FIG. 14).

A hard mask 1490 is formed on the semiconductor layer 1460 (1304). For example, a multi-layer hard mask 1490 can be formed that comprises a silicon dioxide ($SiO_2$) layer on the semiconductor layer 1490, a polysilicon layer on the $SiO_2$ layer and a silicon nitride (SiN) layer on the polysilicon layer.

Figure 15:
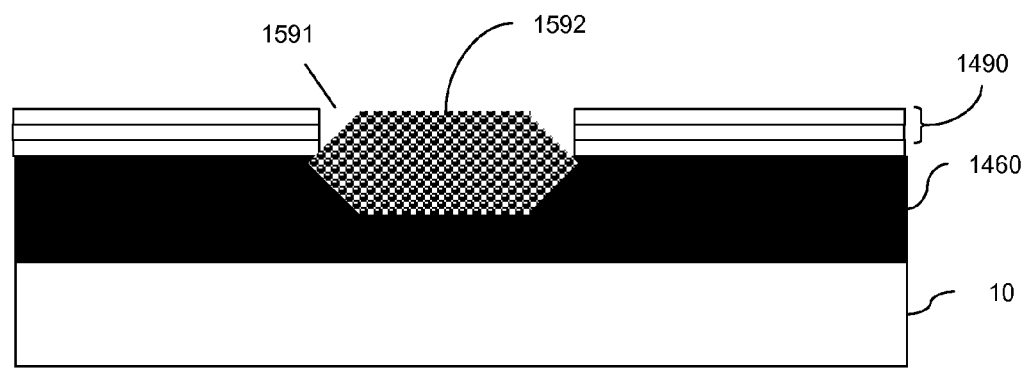
FIG. 15 is a schematic diagram illustrating a cross-sectional view of a partially completed field effect transistor 400.

A trench or opening 1591 can be etched through the hard mask 1490 to expose a section of the semiconductor layer 1460 (1306, see FIG. 15). The exposed surface of the semiconductor layer 1460 is oxidized (e.g., using a poly-buffered local oxidation process) to form an oxidized portion 1592 of the semiconductor layer (1308, see FIG. 15). Due to the poly-buffered local oxidation process and specifically, due to the various layers in the hard mask, the oxidized portion 1592 extends a predetermined depth into the semiconductor layer 1460 and is tapered upwards at the outer edges.

Figure 16:
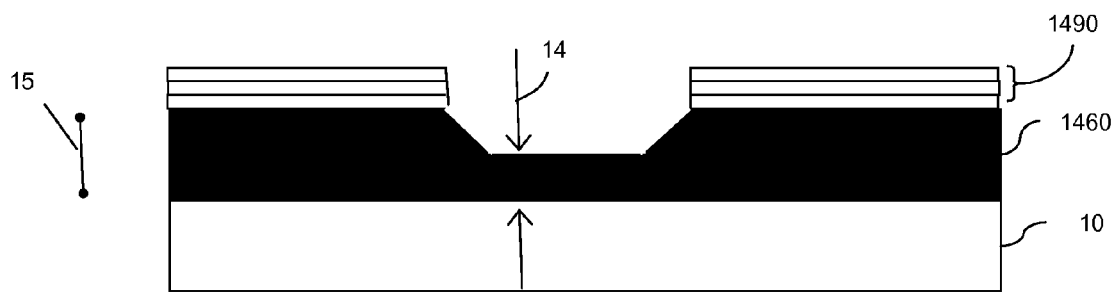
FIG. 16 is a schematic diagram illustrating a cross-sectional view of a partially completed field effect transistor 400.

The oxidized portion 1592 of the semiconductor layer 1460 is removed (e.g., by wet etch, selective non-directional etch, etc.) and the remainder of the semiconductor layer 1460 in this section is left with a reduced height 14 (i.e., the first height) that is less than (e.g., approximately ½) the height 15 of the rest of the semiconductor layer 1460 (i.e., the second height) (1310, see FIG. 16). As mentioned above, due to the poly-buffered local oxidation process, the oxidized portion 1592 extends a predetermined depth into the semiconductor layer and is tapered upwards at the outer edges. Thus, when this oxidized portion is removed, the remainder of the semiconductor layer 1460 in this section has an approximately planar surface at the first height 14 and this surface is tapered at the outer edges upwards to the second height 15.

Figure 17:
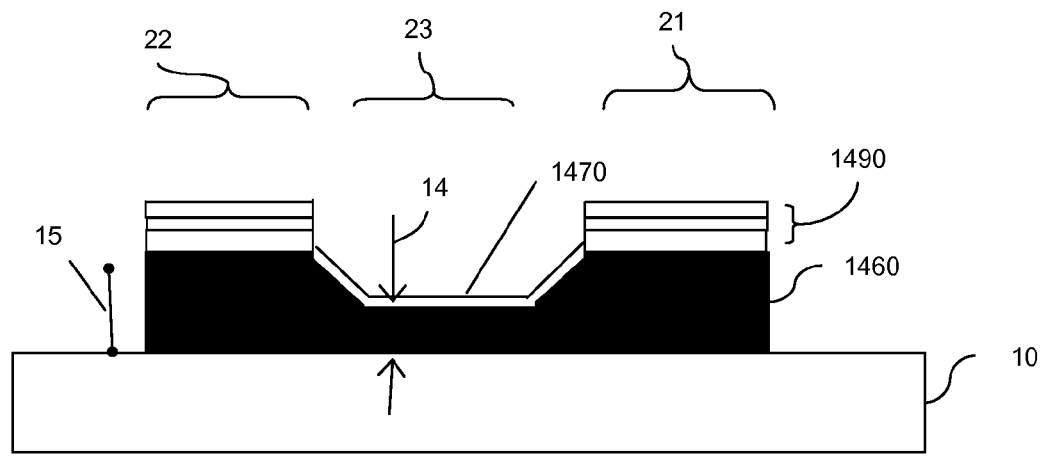
FIG. 17 is a schematic diagram illustrating a cross-sectional view of a partially completed field effect transistor 400.
Figure 18:
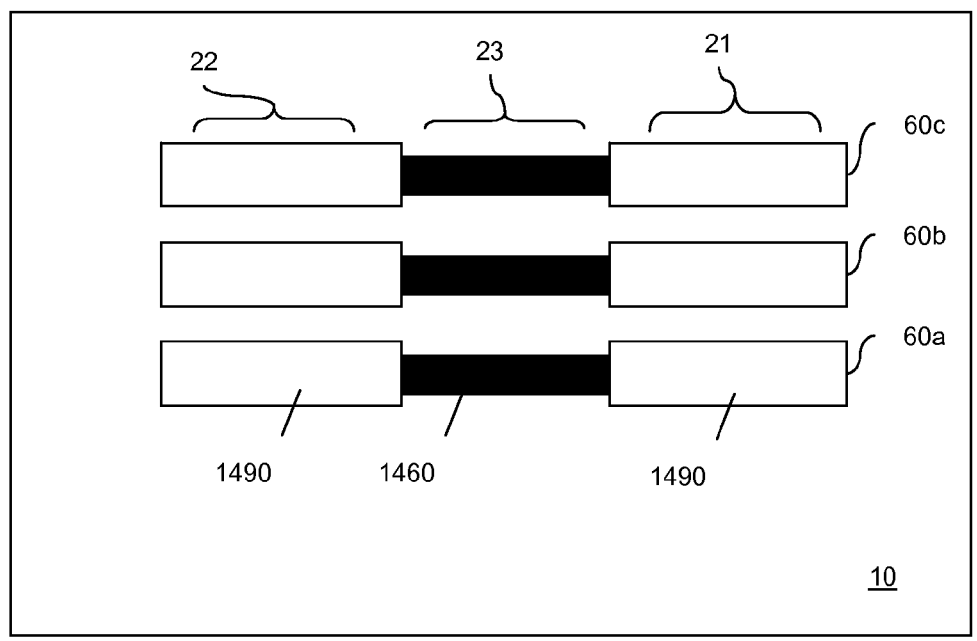
FIG. 18 is a schematic diagram illustrating a top view of the structure of FIG. 17.

After removing the oxidized portion from the semiconductor layer, a dielectric cap 1470 (e.g. a silicon dioxide cap, or a silicon nitride/silicon dioxide stack cap) is formed (1311). Next, parallel fins 60 are formed (e.g., lithographically patterned and etched) in the semiconductor layer 1460-cap 1470/hard mask 1490 stack such that the center portion 23 of each fin 60a-c (i.e., the channel region) has the first height 14 and the ends 21, 22 (i.e., the source/drain regions 41, 42) have the second height 15 (1312-1313, see FIGS. 17-18). The fins are also patterned so that the height to width ratio in the channel region 43 is appropriate for the type of FET being formed (1314). Specifically, if a tri-gate FET is being formed, the fins 60 can be formed so that the center portion 23 has a height to width ratio that ranges between approximately 3:2 and 2:3. Whereas if a finFET is being formed, then the fins 60 can be formed so that the channel portion 23 has a height to width ratio of approximately 4:1 or more. Additionally, the fins 60a-c can be patterned and etched so that the opposing ends 21, 22 (i.e., the source/drain regions 41, 42) are wider than the center portion 23 (i.e., the channel region 43) (1315). For example, the width of the center portion 23 of each fin 60 can be approximately 3-40 nm and the width of the opposing ends 21, 22 can be three or more times wider (e.g., approximately 9-200 nm) than the center portion 23. The dielectric cap 1470 can optionally be removed from above the fins, particularly, if a tri-gate FET is being formed.

Figure 19:
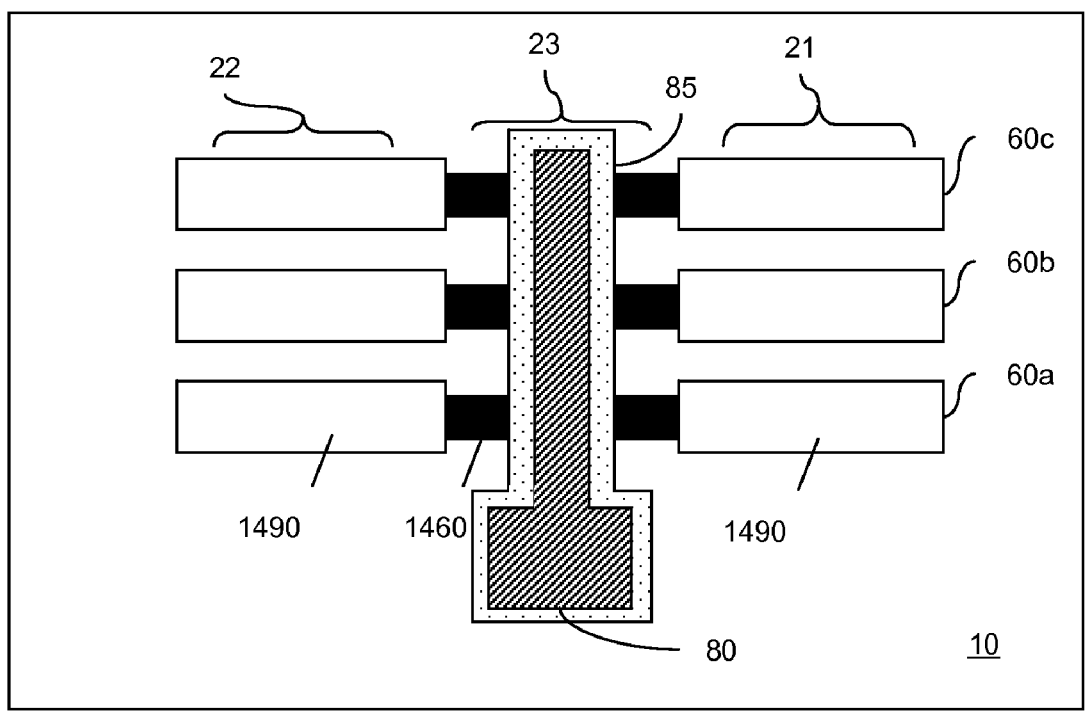
FIG. 19 is a schematic diagram illustrating a top view of a partially completed field effect transistor 400.

After fin formation at process 1312, a gate 80 can be formed that traverses the center portion 23 of each of the fins 60, thereby covering the channel regions 43 (1316, see FIG. 19). Specifically, a thin gate dielectric layer can be deposited or grown on the opposing sidewalls, and optionally the top surface, of the center portion of each fin. Then, a gate conductor can be deposited on the gate dielectric layer and lithographically patterned sot that it extends across the center portion of each fin. Additionally, electrically insulating sidewall spacers 85 (e.g., silicon nitride or silicon dioxide sidewall spacers) can be formed adjacent to the gate sidewalls.

Once the gate 80 is formed, various spacers, extension and halo ion-implants are performed according to the device design requirements (1317). Selective silicon or silicon/germanium can be further be formed on the exposed ends of the fins, and a silicide 50 can be formed on surfaces of the ends of the fins and in the top surface 12 of the gate 80 (1318).

Figure 20:
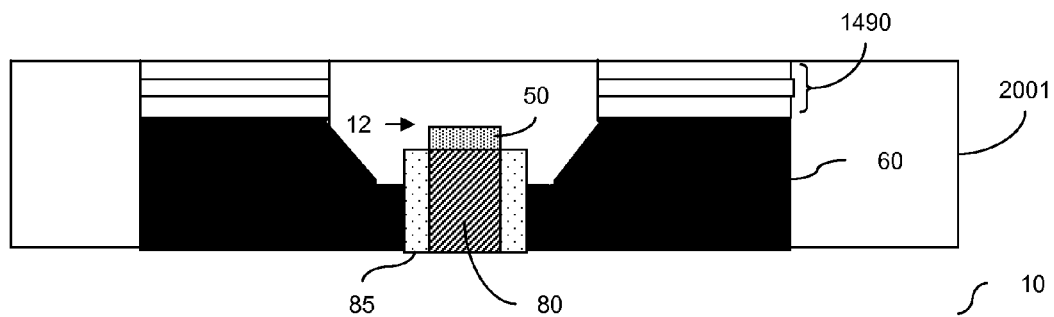
FIG. 20 is a schematic diagram illustrating a cross-sectional view of a partially completed field effect transistor 400.
Figure 21:
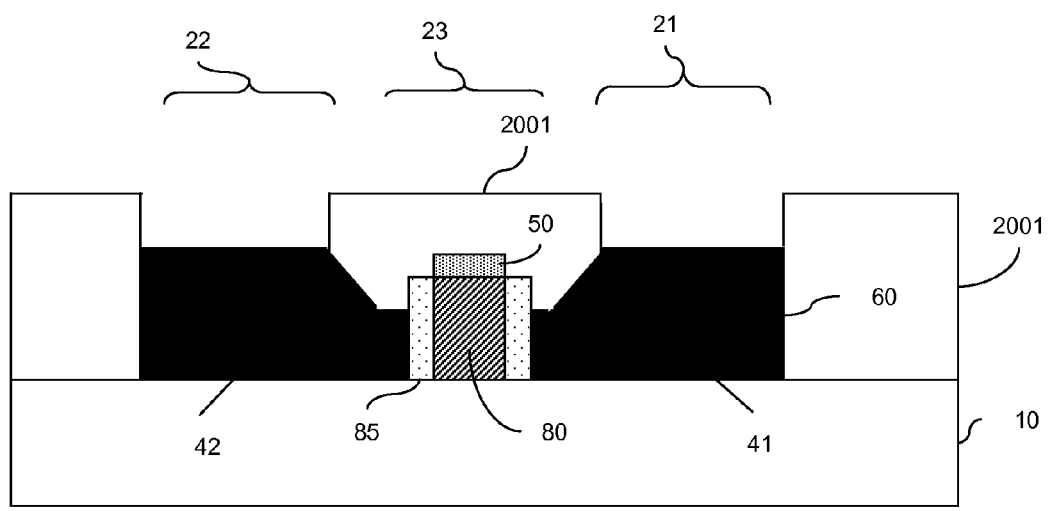
FIG. 21 is a schematic diagram illustrating a cross-sectional view of a partially completed field effect transistor 400.

After the silicide 50 is formed at process 1318, a first dielectric layer 2001 (e.g., an oxide layer) can be formed (e.g., deposited) over the fins and the gate and then, planarized (e.g., using a chemical mechanical planarization process) to expose the hard mask 1490 (1320-1322, see FIG. 20). The remainder of the hard mask 1490 that is exposed can be selectively removed to expose the source/drain regions 41, 42 at the ends 21, 22 of the fins 60, while leaving the 1$^{st}$ dielectric layer 2001 over the gate 80 in the center 23 of each fin 60 (1324, see FIG. 21).

Figure 22:
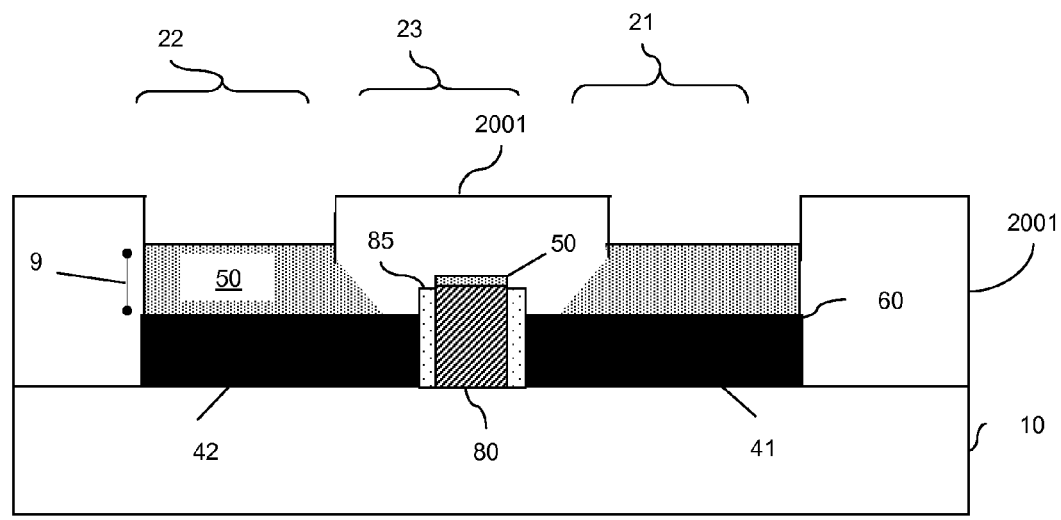
FIG. 22 is a schematic diagram illustrating a cross-sectional view of a partially completed field effect transistor 400.
Figure 23:
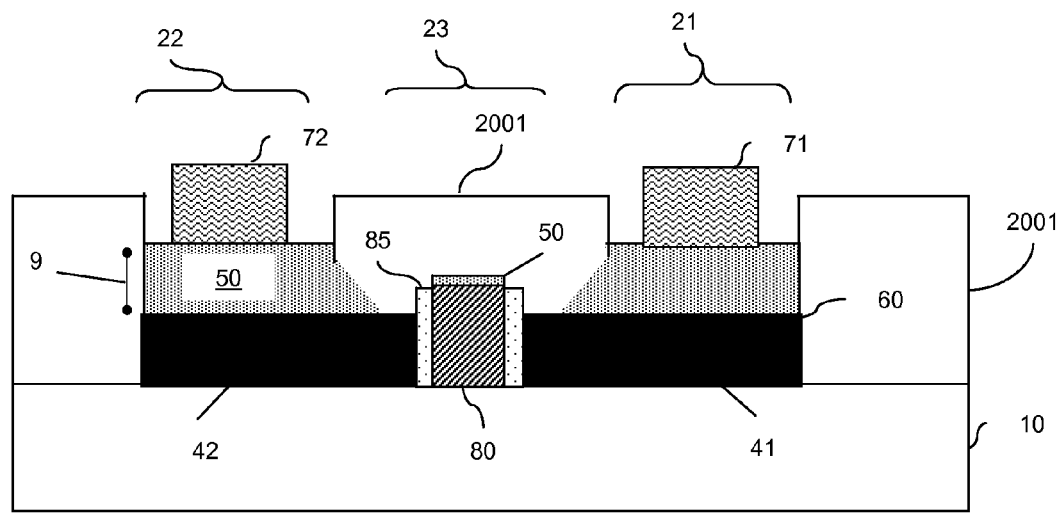
FIG. 23 is a schematic diagram illustrating a cross-sectional view of a partially completed field effect transistor 400.

A silicide 50 (e.g., cobalt, platinum, or nickel silicide) can be formed in a top portion 9 of the exposed source/drain regions 41, 42 of each of the fins. In order to reduce resistance caused by the increased height of the source/drain regions 41, 42, a thick silicide 50 can be formed. For example, the silicide 50 can be formed so that it comprises the entire top half of the source/drain regions (1328, see FIG. 22).

Figure 24:
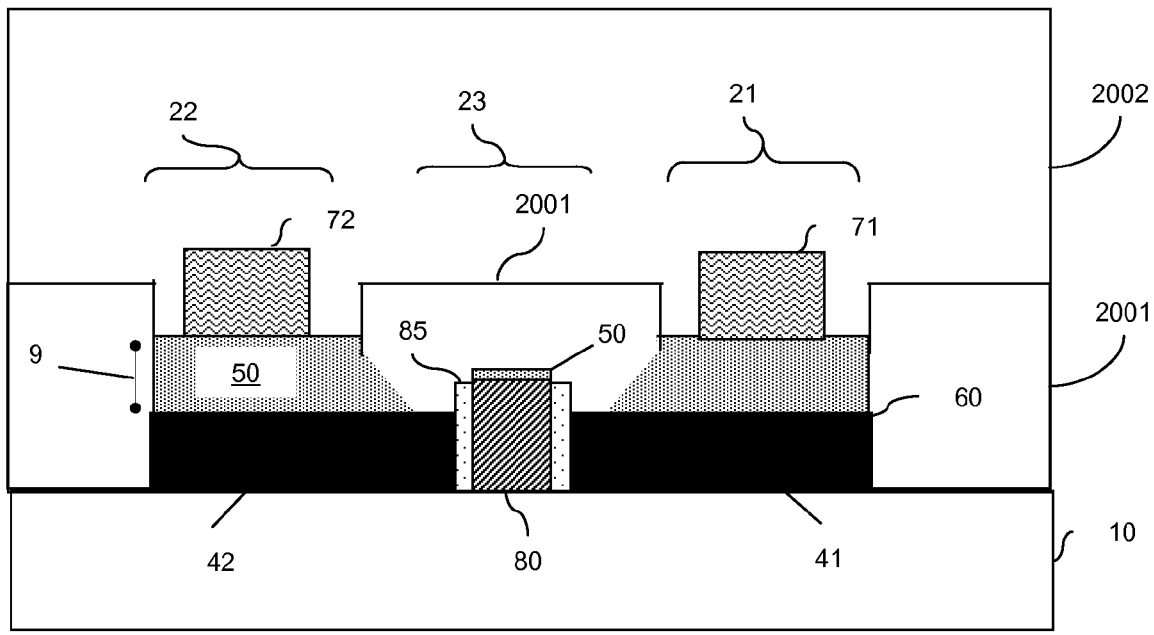
FIG. 24 is a schematic diagram illustrating a cross-sectional view of a partially completed field effect transistor 400.

Conductors 71, 72 (i.e., source/drain straps) are then formed across the exposed source/drain regions 41, 42 and the first dielectric layer 2001 between the fins 60 (1330, see FIG. 24). These source/drain straps 71, 72 can be formed by depositing a blanket layer of a conductive material (e.g., tungsten (W)) over the source/drain regions 41, 42. The conductive material can be lithographically patterned and etched so that source/drain straps are formed that traverse each of the fins 60 at both ends 21, 22 (i.e., a first strap 71 at a first end 21 and a second strap 72 at a second end 22). Since the source/drain straps 71, 72 contact the source/drain regions 41, 42 and the source/drain regions 41, 42 are as tall as or taller than the gate 80, the metal source/drain straps 71, 72 are formed above the level of the gate 80.

Alternatively, a damascene strap process may be used to form the straps 71, 72. During such a damascene strap process, an additional dielectric layer is formed on the surface of the wafer, trenches are patterned and etched to a depth sufficient to expose at least the tops of the silicided fins, and a conductor is deposited (e.g. CVD tungsten, or electroplated copper) to fill the trenches. Then, a CMP or other planarization process is used to remove the conductor from the top surface of the wafer except where the conductor remains filling the previously formed trenches.

After the source/drain straps are formed at process 1330, a second dielectric layer 2002 can be formed (e.g., deposited and planarized) over the structure (i.e., over the straps, over any exposed regions of the fins, over the first dielectric layer, etc.) (1332, see FIG. 24). Vias (i.e., contact vias 91, 92, 93) can be then formed through the second dielectric layer 2001 to the source/drain straps 71, 72 as well as the gate 80 below (1334, see FIGS. 2 and 4).

Therefore, disclosed above are embodiments of a multi-fin field effect transistor structure (e.g., a multi-fin dual-gate FET or tri-gate FET) and method that provides low resistance strapping of the source/drain regions of multiple fins, while also maintaining low capacitance to the gate by raising the level of the straps above the level of the gate. Embodiments of the structure of the invention incorporate either conductive vias or taller source/drain regions in order to electrically connect the source/drain straps to the source/drain regions of each fin. The structure of the invention results in reduced capacitance and, thereby, results in lower operation power of finFET or tri-gate circuits, reduced circuit delay and increased circuit speed. These benefits can be realized in microprocessor, memory, ASIC, analog, Digital Signal Processors, and other large-scale integrated circuit applications.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention described herein can be practiced with modification within the spirit and scope of the appended claims.

What is claimed is:

1. A field effect transistor comprising:
    an isolation layer;
    a plurality of semiconductor fins on said isolation layer, wherein said semiconductor fins are parallel and wherein each of said semiconductor fins has end portions, has a center portion between said end portions and comprises source/drain regions within said end portions and a channel region within said center portion between said source/drain regions;
    a gate covering said channel region of each of said fins; and
    a conductor that traverses and is electrically connected to each of said fins at an end, wherein a first distance between said isolation layer and a top surface of said gate is less than a second distance between said isolation layer and a bottom surface of said conductor.

2. The field effect transistor of claim 1, wherein said conductor comprises a metal strap.

3. The field effect transistor of claim 1, wherein said conductor comprises one of a copper strap and a tungsten strap.

4. The field effect transistor of claim 1, further comprising a second conductor that traverses and is electrically connected to each of said fins at second end.

5. The field effect transistor of claim 1, wherein said source/drain regions are wider than said channel region in each of said fins.

6. A field effect transistor comprising:
    an isolation layer;
    a plurality of semiconductor fins on said isolation layer, wherein said semiconductor fins are parallel and wherein each of said semiconductor fins has end portions, has a center portion between said end portions and comprises source/drain regions within said end portions and a channel region within said center portion between said source/drain regions;
    a gate covering said channel region of each of said fins;
    a conductor that traverses each said fins at an end; and
    a plurality of vias that electrically connect said fins at said end to said conductor, wherein a first distance between said isolation layer and a top surface of said gate is less than a second distance between said isolation layer and a bottom surface of said conductor.

7. The field effect transistor of claim 6, wherein said conductor comprises a metal strap.

8. The field effect transistor of claim 6, wherein said conductor comprises a copper strap and wherein said vias comprise copper-filled vias.

9. The field effect transistor of claim 6, further comprising a conductive liner in said vias, wherein said conductive liner comprises one of titanium, titanium nitride, tantalum and tantalum nitride.

10. The field effect transistor of claim 6, wherein a predetermined length of said vias is greater than a height of said gate above said fins.

11. The field effect transistor of claim 6, further comprising a second conductor that traverses and is electrically connected to each of said fins at a second end.

12. The field effect transistor of claim 6, wherein said source/drain regions are wider than said channel region in each of said fins.

13. A field effect transistor comprising:

an isolation layer;

a plurality of semiconductor fins on said isolation layer, wherein said semiconductor fins are parallel and wherein each of said semiconductor fins has end portions, has a center portion between said end portions and comprises source/drain regions within said end portions and a channel region within said center portion between said source/drain regions;

a gate covering said channel region of each of said fins; and a conductor that traverses and is electrically connected to each of said fins at an end, wherein said channel region has a first height that is shorter than a second height of said source/drain regions such that a first distance between said isolation layer and a top surface of said gate is less than a second distance between said isolation layer and a bottom surface of said conductor.

14. The field effect transistor of claim 13, wherein said conductor comprises a metal strap.

15. The field effect transistor of claim 13, wherein said conductor comprises a tungsten strap.

16. The field effect transistor of claim 13, wherein said second height is approximately twice said first height.

17. The field effect transistor of claim 13, wherein a top portion of each of said fins in said source/drain regions comprises a silicide.

18. The field effect transistor of claim 13, wherein a top half of each of said fins in said source/drain regions comprises a silicide.

19. The field effect transistor of claim 13, further comprising a second conductor that traverses and is electrically connected to each of said fins at a second end.

20. The field effect transistor of claim 13, wherein said source/drain regions are wider than said channel region in each of said fins.

* * * * *